(12) United States Patent
Ezell (10) Patent No.: US 7,078,960 B2
(45) Date of Patent: Jul. 18, 2006

(54) METHOD AND SYSTEM FOR FILTER TUNING USING A DIGITAL TRIM VALUE

(75) Inventor: R. William Ezell, Wylie, TX (US)

(73) Assignee: Microtune (Texas), L.P., Plano, TX (US)

( * ) Notice: Subject to any disclaimer, the term of this patent is extended or adjusted under 35 U.S.C. 154(b) by 332 days.

(21) Appl. No.: 10/629,019

(22) Filed: Jul. 28, 2003

(65) Prior Publication Data
US 2005/0024252 A1    Feb. 3, 2005

(51) Int. Cl.
H04B 1/10    (2006.01)

(52) U.S. Cl. ......................... 327/553; 327/552; 341/169

(58) Field of Classification Search ............... 341/169; 327/552–553
See application file for complete search history.

(56) References Cited

U.S. PATENT DOCUMENTS

| | | | |
|---|---|---|---|
| 4,841,461 A * | 6/1989 | Yamamoto et al. ......... | 702/197 |
| 5,245,646 A | 9/1993 | Jackson et al. ................ | 377/2 |
| 5,281,931 A * | 1/1994 | Bailey et al. ............. | 333/17.1 |
| 5,345,119 A * | 9/1994 | Khoury ....................... | 327/553 |
| 5,352,934 A | 10/1994 | Khan ....................... | 307/296.1 |
| 5,625,317 A * | 4/1997 | Deveirman ................. | 327/553 |
| 5,914,633 A * | 6/1999 | Comino et al. ............. | 327/553 |
| 6,112,125 A | 8/2000 | Sandusky .................... | 700/28 |
| 6,304,135 B1* | 10/2001 | Muza ......................... | 327/553 |
| 6,512,414 B1* | 1/2003 | Yokoyama et al. .......... | 327/553 |
| 6,710,644 B1* | 3/2004 | Duncan et al. ............. | 327/558 |
| 6,803,813 B1* | 10/2004 | Pham ......................... | 327/553 |
| 2003/0090316 A1 | 5/2003 | Dathe et al. ................ | 327/554 |

FOREIGN PATENT DOCUMENTS

EP    1 172 933 A2    1/2002

OTHER PUBLICATIONS

Laker, et al., "Design of Analog Integrated Circuits and Systems," pp. 786-791 plus copyright page, 1994 unknown month.
Geiger, et al., "VLSI Design Techniques for Analog and Digital Circuits," McGraw-Hill Publishing Company, pp. 651-656 plus title and copyright pages, 1990 unknown month.
Martinez, et al., "A 60-mW 200-MHz Continuous-Time Seventh-Order Linear Phase Filter With On-Chip Automatic Tuning System," IEEE Journal of Solid-State Circuits, vol. 38, No. 2, pp. 216-225 plus cover page, Feb. 2003.
PCT/US2004/021750, Notification of Transmittal of the International Search Report and the Written Opinion of the International Searching Authority, or the Declaration, 8 pgs, Jan. 26, 2005.

* cited by examiner

Primary Examiner—Rexford Barnie
Assistant Examiner—Khai M. Nguyen
(74) Attorney, Agent, or Firm—Baker Botts L.L.P.

(57) ABSTRACT

A method for storing a result of a tuning process includes generating a first characteristic signal using a signal generator. The method also includes generating a second characteristic signal using a master circuit, wherein the master circuit generates the second characteristic signal in response to a current signal. The method further includes determining an adjustment to the current signal based at least in part upon the first and second characteristic signals, and storing a digital value representing the adjustment.

29 Claims, 4 Drawing Sheets

METHOD AND SYSTEM FOR FILTER TUNING USING A DIGITAL TRIM VALUE

TECHNICAL FIELD OF THE INVENTION

This invention relates in general to tuning analog filters, and more particularly to a method and system for filter tuning using a digital trim value.

BACKGROUND OF THE INVENTION

Tuning devices for receiving, transmitting, and decoding signals frequently use electronic filters to isolate portions of the signal. Depending on the requirements of the tuning device, such analog filters may need to be tuned to a high degree of precision. Techniques for manufacturing filters do not necessarily produce perfect filters, and as a result, the filters may need to be tuned to the proper range. In certain devices, internal oscillators are used to tune filters, but such oscillators may consume a relatively large amount of power and have the risk of creating interference, noise, or other undesirable effects.

SUMMARY OF THE INVENTION

In accordance with the present invention, a method and system for filter tuning using a trim value is disclosed. Certain embodiments of the present invention substantially reduce or eliminate disadvantages associated with previous methods of filter tuning. In particular, certain embodiments of the present invention allow the result of a tuning process to be stored as a trim value and used to tune a filter automatically.

In a particular embodiment, a method for storing a result of a filter tuning process includes generating a first characteristic signal and generating a second characteristic in response to a current signal. The method further includes determining an adjustment to the current signal based at least in part upon the first and second characteristic signals, and storing a digital value representing the adjustment.

Technical advantages of certain embodiments of the present invention include representing a tuning process using a stored trim value. This allows an analog filter to function without continuously being tuned using signal generators, oscillators, or other methods that may require additional power and contribute interference, noise, or other undesirable effects to the circuit. Furthermore, the tuning process may be repeated, and the use of a trim value allows the process to be adapted to digital control, analog control, or a combination thereof.

Another technical advantage of certain embodiments of the present invention is that the techniques may be employed in an on-chip design. Thus, an integrated circuit may include automatic on-chip tuning that tunes a filter in the circuit when the chip is supplied with power. In such embodiments, the chip may use high-stability components to minimize drift once the filter is tuned, allowing the chip to function reliably without requiring the tuning process to be repeated. Such embodiments may present advantages over systems that require continuous tuning.

Other technical advantages of the present invention will be readily apparent to one skilled in the art from the figures, descriptions, and claims included herein. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
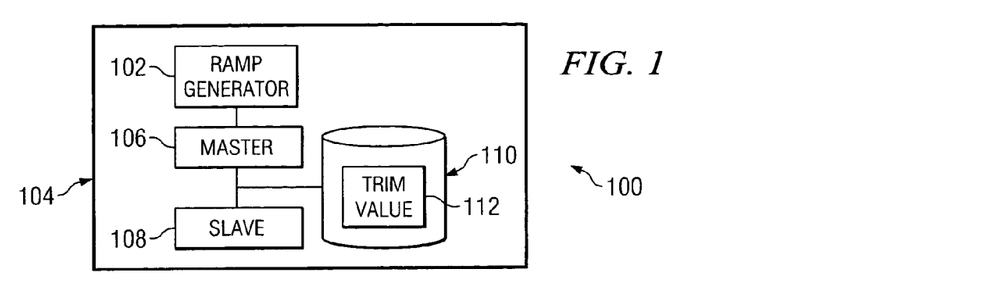
FIG. 1 illustrates a filter tuning system according to a particular embodiment of the present invention.

FIG. 1 is a high-level diagram of a filter system 100. System 100 embodies a master-slave tuning arrangement in which a master circuit 106 is tuned using a ramp generator 102, and the result of the tuning process is stored in memory 110 as a trim value 112. Trim value 112 is in turn used to tune a slave filter 108. In particular embodiments, master circuit 106, slave filter 108 and portions of ramp generator 102 are formed on an integrated circuit 104.

Ramp generator 102 may include any device for generating a characteristic electronic signal used to tune master circuit 106. For example, ramp generator 102 may be a reference capacitor that is charged using a known current. Depending on the level of precision required for the operation of system 100, the components of ramp generator 102 may be appropriately selected to have a maximum variation within acceptable limits.

Master circuit 106 comprises any number and combination of components used, in combination with ramp generator 102, to derive trim value 112 for a filter tuning process. Master circuit 106 and slave filter 108 need not have identical components, so long as there is some quantifiable relationship between them so that the result of a tuning process applied to master circuit 106 may be used to tune slave filter 108.

Filter 108 comprises any number and combination of components that produce a frequency-dependent response to an input signal. Filter 108 may include any suitable electronic components, such as, for example, capacitors, inductors, resistors, transistors, and/or amplifiers. Filter 108 is tuned by adjusting one or more component values such that filter 108 responds accurately to input signals. For example, filter 108 may include components with adjustable resistance, capacitance, or transconductance. In a particular embodiment, filter 108 is a $G_m$-C filter whose characteristic frequency is determined by a capacitance value and a transconductance value.

Memory 110 may be any form of information storage, whether volatile or non-volatile, such as, for example, optical media, magnetic media, or removable media.

Memory 110 stores trim value 112, which represents the results of the process used to tune master circuit 106. Memory 110 maintains trim value 112 even if one or more components of system 100 are powered down, disconnected, or otherwise disabled, such as, for example, after a tuning process is completed. Trim value 112 may include any type of quantifiable representation of the process using any number of digital bits. In particular embodiments, the number of bits in trim value 112 corresponds to the number of iterations performed in the tuning process.

In operation, ramp generator 102 generates a reference signal that is used to adjust component values of master circuit 106 until it is determined that master circuit 106 is properly tuned. The results of this tuning process are stored in memory 110 as trim value 112. Trim value 112 is in turn used to adjust component values of slave filter 108. Because of the known relationship between components of master circuit 106 and slave filter 108, slave filter 108 may be properly tuned based on the information recorded in trim value 112. Particular embodiments of these techniques are described in detail below.

Figure 2:
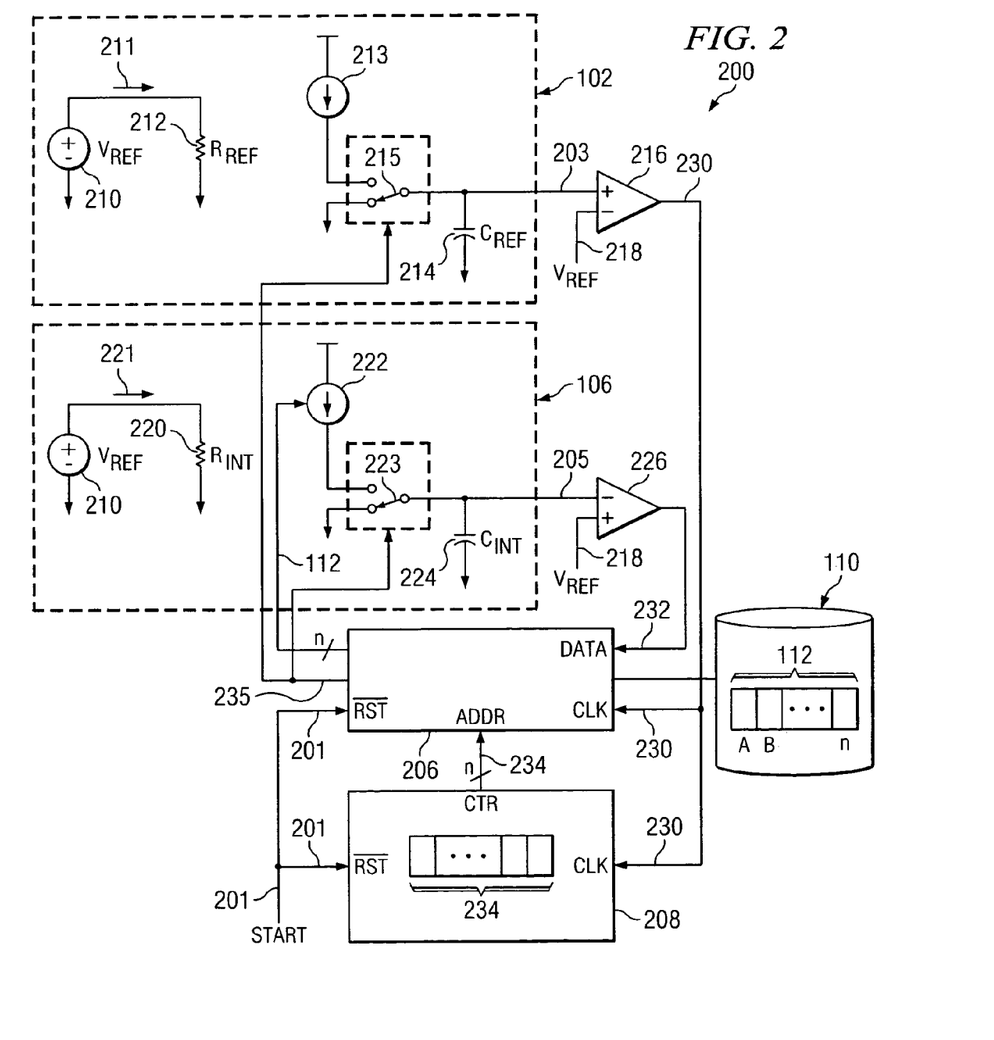
FIG. 2 illustrates a circuit for tuning a filter and storing the result as a trim value, according to a particular embodiment of the present invention.

FIG. 2 shows a particular embodiment of a circuit 200 that uses ramp generator 102 to tune master circuit 106 and to store the result in memory 110 as trim value 112. Circuit 200 tunes circuit 106 using an iterative process made of charging steps repeated n times, wherein n may be a number that is predetermined or may alternatively be a number that is determined during the tuning process, up to the number of bits in memory 110. In the depicted embodiment, circuit 200 includes ramp generator 102, circuit 106, memory 110, controller 206, counter 208, and comparators 216 and 226.

Ramp generator 102 includes a reference voltage source 210 coupled to a reference resistor 212 to produce a current 211. Current source 213 generates a charging current having a value that is a multiple of the value of current 211. The current from current source 213 may be connected and disconnected from capacitor 214 using switch 215, which may include any suitable form of switch, relay, or other device for establishing or interrupting an electrical connection. The current generated by current source 213 charges capacitor 214, producing a voltage ramp on voltage 203, when switch 215 is placed in a charging position. Switch 215 additionally contains an alternate discharge position. When in this position, capacitor 214 is connected to a ground potential through switch 215. Control line 235 sets the position of switches 215 and 223.

The characteristic values of voltage source 210, resistor 212, and capacitor 214 are known within a certain degree of precision, and this in turn determines the degree of precision to which ramp generator 102 is reliable as a reference. In particular embodiments, reference resistor 212 and reference capacitor 214 are external to integrated circuit 104.

Comparator 216 compares an output voltage 203 of ramp generator 102 with a reference voltage 218. The value of reference voltage 218 may be a multiple of the value of reference voltage source 210. When output voltage 203 of ramp generator 102 exceeds reference voltage 218, comparator 216 switches its output from low to high, effectively producing a CLK signal 230 indicating the time at which output voltage 203 reaches the threshold of reference voltage 218.

Circuit 106 includes reference voltage source 210 coupled to resistor 220 to produce a current 221. Current source 222 generates a charging current having a value that is based upon the value of current 221 as well as trim value 112. The current from current source 222 may be connected and disconnected from capacitor 224 using switch 223, which may include any suitable form of switch, relay, or other device for establishing or interrupting an electrical connection. Capacitor 224 generates an output voltage 205 in response to receiving a current signal from current source 222 when switch 223 is placed in the charging position.

Current source 222 is adjustable, allowing output voltage 205 of circuit 106 to be tuned by adjusting the current generated by current source 222. In the tuning process, the current generated by current source 222 is increased or decreased after each iteration of the tuning process to bring output voltage 205 of circuit 106 closer to output voltage 203 of ramp generator 102. Trim value 112 records these adjustments, thus providing a record of the tuning process. Components of circuit 106 are selected to correspond to slave filter 108, so that the result of the tuning process corresponds to a similar tuning process for slave filter 108. For example, the current adjustments made to current source 222 may correspond to adjustments in a transconductance that controls current flow in slave filter 108. Thus, the series of adjustments in the current generated by current source 222 recorded as trim value 112 may be used to tune slave filter 108.

Comparator 226 compares output signal 205 of circuit 106 to reference voltage 218. Comparator 226 produces an output, DATA signal 232, that indicates whether the output signal of circuit 106 is greater than or less than reference voltage 218. The operation of comparator 226 is used to determine the relationship between the output voltages 203 and 205 of ramp generator 102 and circuit 106, respectively, and to determine, based on that relationship, an adjustment to current source 222 of circuit 106, whether increase or decrease, that will bring output voltage 205 of circuit 106 closer to output voltage 203 produced by ramp generator 102. Comparator 226 may produce DATA signal 232 continuously, or alternatively, may generate DATA signal 232 in response to an external trigger, such as CLK signal 230.

Controller 206 refers to any component that controls the operation of circuit 200, and may include any manner of processor, controller, hardware and/or software for performing the described tasks of circuit 200. Controller 206 is coupled to counter 208, which may include any form of volatile or non-volatile information storage that can maintain a numerical count 234 and output count 234 as an electrical signal. Controller 206 stores information in a particular bit of trim value 112 in response to receiving CLK signal 230 from comparator 216. In the depicted embodiment, trim value 112 includes multiple bits, each of which is identified by an address, with the most significant bit corresponding to the first step of the tuning process. When storing information, controller 206 stores the information in the bit having an address corresponding to count 234 on counter 208.

In the initial state of circuit 200, controller 206 and counter 208 receive a START signal 201 that initializes memory 110 and counter 208. Using control line 235, controller 206 also positions switches 215 and 223 in the discharging position, connected to a ground potential, to initialize capacitors. To commence the tuning process, controller 206 simultaneously places switches 215 and 223 in the charging position to commence charging of capacitors 214 and 224. Once output voltage 203 across capacitor 214 reaches reference voltage 218, comparator 216 produces CLK signal 230, which increments counter 208. Controller 206 receives CLK signal 230, and in response, controller 206 determines the value of DATA 232 at that moment in time. DATA signal 232 indicates whether output voltage 205 of circuit 106 is greater or less than reference voltage 218.

Controller 206 then tunes current source 222. The particular tuning process used to bring output voltage 205 of circuit 106 closer to output voltage 203 of ramp generator 102 may vary in different embodiments of circuit 200. In one example of such a process, the current produced by current source 222 is increased by a certain amount if output voltage 205 of circuit 106 is too low, and decreased by a certain amount if output voltage 205 is too high. In another example, the current may either remain at its present value after each iteration or increase by a certain amount. The amount of current adjustment may vary depending on the number of the iteration, so that, for example, the first iteration may have the largest magnitude, and each subsequent iteration may produce progressively finer adjustments.

To tune current source 222, controller 206 first determines the proper adjustment to the current produced by current source 222, based on DATA signal 232 and according to the particular tuning process used by circuit 200. Controller 206 records the adjustment as a bit of trim value 112. The bit selected has an address that corresponds to count 234 on counter 208, so that each bit corresponds to the result of a particular iteration of the tuning process. The value of the bit indicates the direction of adjustment (increase or decrease). For example, a value of zero may correspond to a decrease, while a value of one corresponds to a current increase. In another example, a value of zero may correspond to no change, while a value of one corresponds to a current increase. The position of the bit, from most significant to least significant, may be used to determine the amount of adjustment. To adjust the current of current source 222, controller communicates trim value 112 to current source 222, which adjusts its output current accordingly. Current source 222 may be suitably programmed to perform any necessary calculations or other tasks to implement the adjustment determined by controller 206 based on trim value 112.

Once the adjustment to the current generated by current source 222 has been made and recorded, the process may be repeated. Using control line 235, controller 206 resets switches 215 and 223 to discharge capacitors 214 and 224. Controller 206 then restores both switches 215 and 223 to the charging position, and repeats the process of determining the proper adjustment to the current and storing the results, while counter 208 increments for each iteration. Thus, trim value 112 records the results of each step of the tuning process as a bit, so that the final trim value 112 after the process is complete represents the result of the entire tuning process.

The steps of the process may be repeated a predetermined number of times, up to the capacity of memory 110. Circuit 200 may also be adapted to stop adjusting the current once the output voltage of ramp generator 102 and circuit 106 are within a certain range of one another, rather than using a fixed number of iterations. Furthermore, the values corresponding to particular iterations may use multiple rather than single bits. These and other similar variations do not represent significant departures from the scope of the particular embodiments described.

Figure 3:
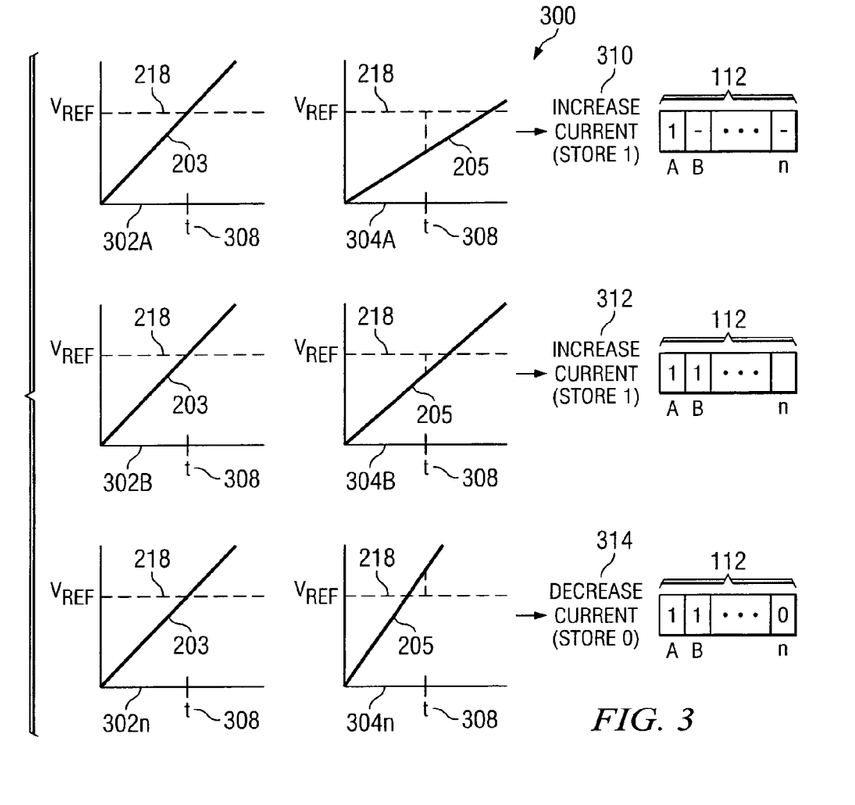
FIG. 3 shows voltage-time graphs corresponding to steps of a tuning process performed in the circuit of FIG. 2.

FIG. 3 is a series 300 of graphs that illustrate iterations of the tuning process in terms of voltages 203 and 205 across capacitors 214 and 224, respectively. The set of graphs corresponding to each iteration is labeled with a particular letter ("A" for the first iteration, "B" for the second iteration, and "n" for the n-th iteration). Trim value 112 shows the bit values stored after each iteration, with the bit corresponding to each iteration identified by the same letter as that iteration.

Graphs 302 (referring generally to graphs 302A, 302B, ... 302n) illustrate the value of output voltage 203 of ramp generator 102 versus time during respective iterations of the tuning process. Time t 306 is the time at which output voltage 203 reaches reference voltage 218. Because output voltage 203 is produced by a current source 213 and capacitor 214 with fixed values, the curve shown is identical in graphs 302A, 302B, ... , 302n, and is shown for each iteration for reference purposes.

Graphs 304 (referring generally to graphs 304A, 304B, ... , 304n) illustrate the value of output voltage 205 of circuit 106 versus time during respective iterations of the tuning process. Reference voltage 218 also appears on graphs 304, and the value of DATA signal 232 of comparator 226 at a particular time may be determined by comparing output voltage 205 to reference voltage 218 at that time. Of particular interest is the value of voltage 205 at time t 306, since this is the time at which controller 206 determines the adjustment to the current value for a particular iteration based on DATA signal 232 and stores a record of the adjustment in the associated bit of trim value 112.

Series 300 proceeds through the iterations as follows. In iteration A, output voltage 203 reaches reference voltage 218 at time t 306, causing comparator 216 to produce CLK signal 230 at time t 306. CLK signal 230 in turn causes controller 206 to read the value of DATA signal 232 at time t 306. As graph 304A illustrates, output voltage 205 is less than reference voltage 218 at time t 306, and DATA signal 232 will thus have the value "one" at time t 306. This indicates that the current used to charge capacitor 224 needs to be increased in order to match output voltage 203 of ramp generator 102. Thus, the response 310 of controller 206 is to store a one in the bit of trim value 112 corresponding to iteration A and to increase the current of current source 222 accordingly.

In the subsequent iteration B, capacitor 224 is charged using a higher current. This causes output voltage 205 of capacitor to reach reference voltage 218 more quickly. However, as graph 304B indicates, output voltage 205 still does not reach reference voltage 218 at time t 306. Because output voltage 205 has not reached reference voltage 218, the value of DATA signal 232 at time t 306 is again one, indicating that the current of current source 222 needs to be increased. Thus, the response 312 of controller 206 is to store a one in the bit of trim value 112 corresponding to iteration B and to increase the current of current source 222 accordingly.

In iteration n, the current from current source 222 has been increased to the point that output voltage 205 reaches reference voltage 218 before time t 306, as illustrated in graph 304n. Comparator 226 thus produces a value of "zero" for DATA signal 232 at time t 306, indicating that the current from current source 222 needs to be lowered. Thus, the response 314 of controller 206 is to store a zero in the bit of time value 112 corresponding to iteration n, and to decrease the current of current source 222 accordingly.

As noted previously, the number of iterations may be predetermined or determined during the tuning process, such as by ending the tuning process whenever output voltage 205 is within a certain range of reference voltage 218 at time t 306. The particular comparisons and responses described here are only examples, and the described techniques may be adapted in various ways, including any variation consistent with the embodiments described above. Once the tuning process is complete, trim value 112 may be used to tune slave filter 108 based on correspondence between the tuning process applied to master circuit 106 and the associated tuning process for slave filter 108.

Figure 4:
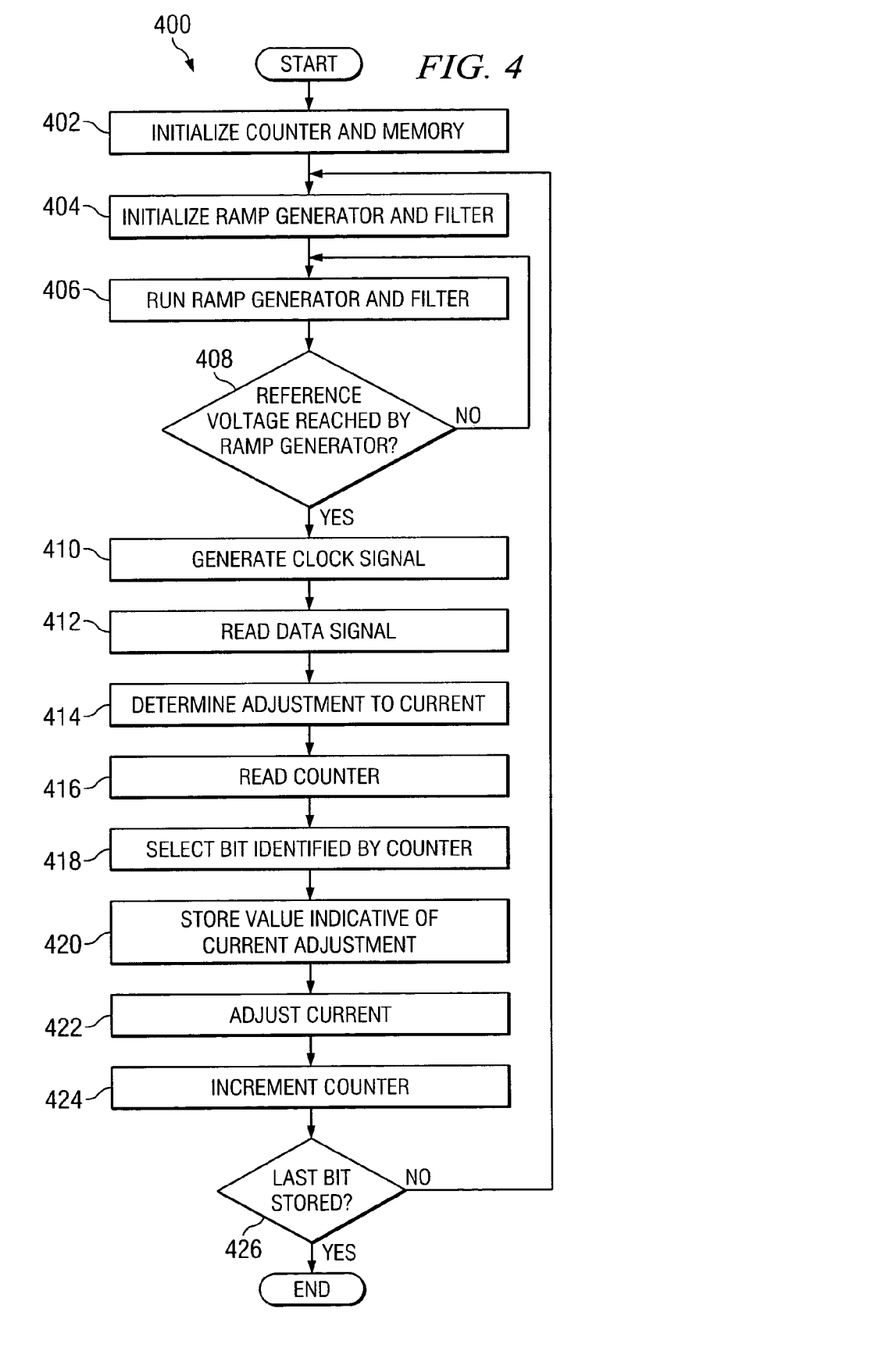
FIG. 4 is a flow chart illustrating one example of a method for storing the result of a tuning process as a trim value.

FIG. 4 is a flow chart illustrating an example of a method of operation for circuit 200. The values of counter 208 and memory 110 are initialized at step 402. Ramp generator 102 and circuit 106 are initialized by discharging capacitors 214 and 224 at step 404. Ramp generator 102 and circuit 106 are switched to charging position at step 406. Capacitors 214 and 224 are charged until the voltage across capacitor 214 reaches reference voltage 218, as shown in decision step 408.

In response to capacitor 214 reaching reference voltage 218, comparator 216 generates CLK signal 230 at step 410. At step 412, controller 206 reads the value of DATA signal 232 at the time CLK signal 230 is received. Based on the value of DATA signal 232, controller 206 determines an adjustment to the current of current source 222 at step 414. Controller 206 reads count 234 from counter 208 at step 416, and selects a bit of trim value 112 that has an address corresponding to count 234 at step 418. At step 420, controller 206 stores a value in the selected bit that represents the adjustment to current that controller 206 previously determined at step 414. Controller 206 then makes the adjustment to the current produced by current source 222 at step 422 by communicating trim value 112 to current source 222.

Once the current adjustment is made, counter 208 increments at step 424. Controller 206 then determines whether all desired bits of trim value 112 have been stored at step 426. This determination may be based on the particular tuning process used. For example, in one tuning process, controller 206 may continue the method until all bits of trim value 112 are filled. In another example, controller 206 may end the method when output voltage 205 is sufficiently close to reference voltage 218. If all desired bits are not yet stored, controller 206 may re-initialize ramp generator 102 and circuit 106 at step 404 and continue with the method from there. Otherwise, the method is at an end.

Figure 5:
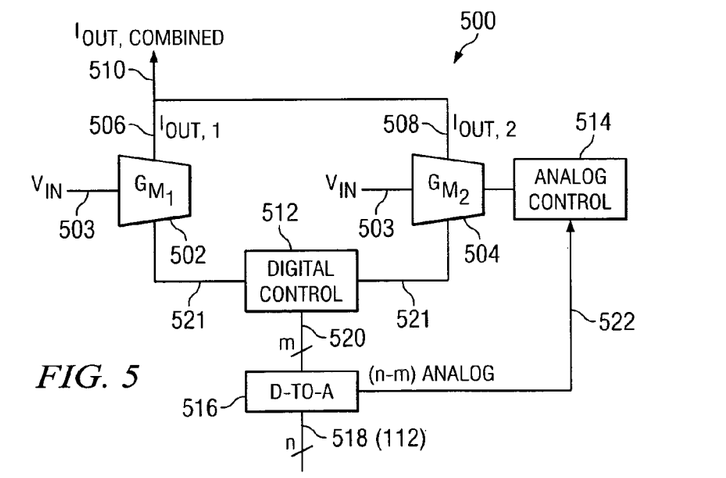
FIG. 5 illustrates a circuit for tuning a transconductor using a trim value, according to a particular embodiment of the present invention.
Figures 6, 7, 8:
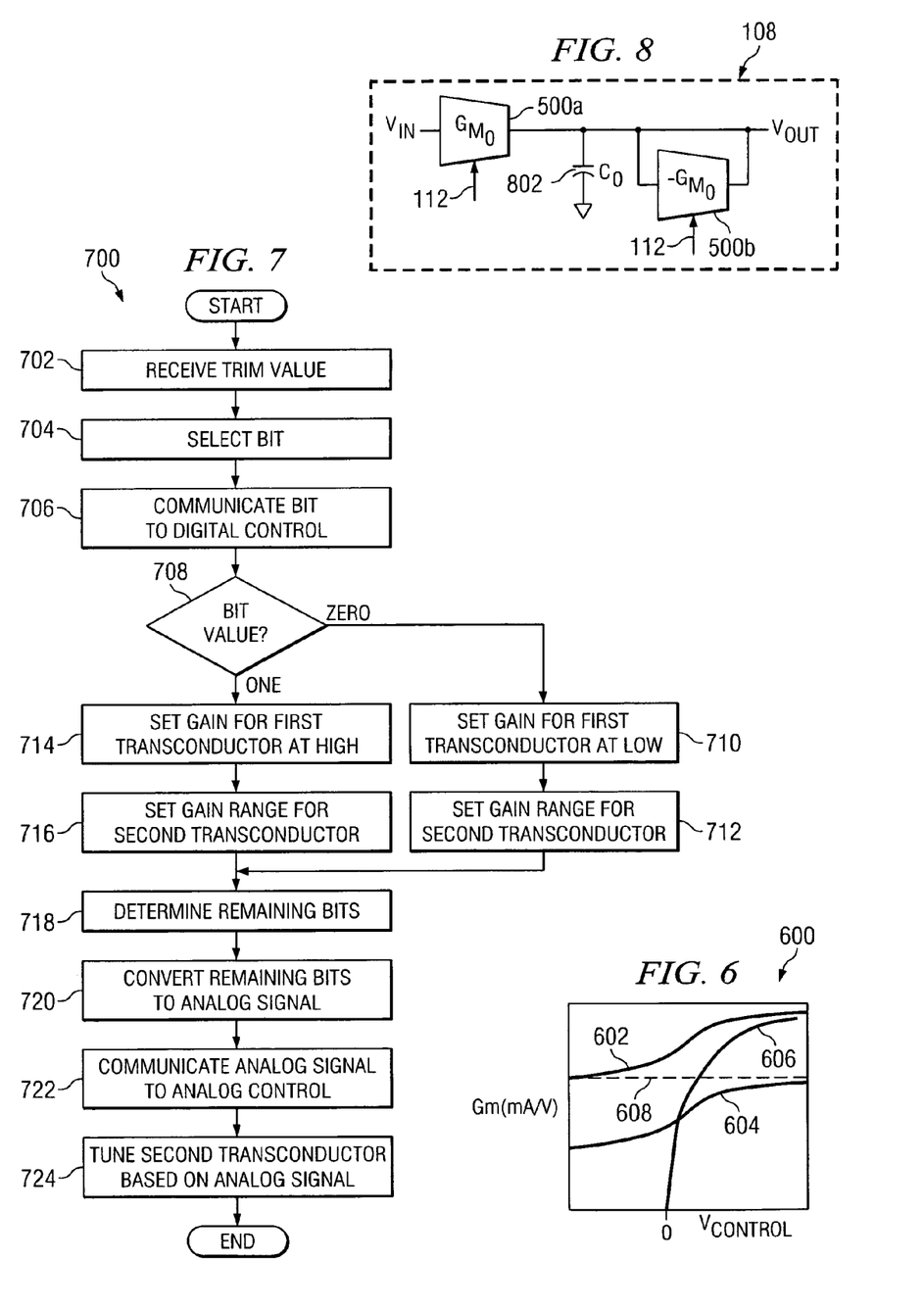
FIG. 6 is a transconductance-voltage graph illustrating the response of the circuit of FIG. 5 to a change in input voltage.
FIG. 7 is a flow chart illustrating an example of a method for tuning a transconductor using a trim value.
FIG. 8 illustrates a slave filter according to a particular embodiment of the present invention.

The previous description of FIGS. 1–4 explains particular embodiments of techniques for performing and storing the result of a tuning process as trim value 112. As described above, trim value 112 records the adjustments made to the current used to charge master circuit 106 during one or more iterations of a tuning process. The information stored in trim value 112 may then be used to tune slave filter 108 in a related tuning process. FIGS. 5–7 and the associated description in turn describe particular embodiments of techniques for using trim value 112 to tune slave filter 108.

In general, storing trim value 112 allows the tuning process to be performed on slave filter 108 without requiring master circuit 106 and slave filter 108 to be tuned simultaneously and continuously. In this regard, system 100 implements indirect tuning. Because trim value 112 may be stored, slave filter 108 may be tuned after master circuit 106 is tuned, so that the tuning does not have to be performed simultaneously on both filters. Because slave filter 108 is adjusted based upon the tuning results of circuit 200, slave filter 108 does not require its own signal generator as a tuning reference. This is advantageous because signal generators require power and contribute thermal noise and/or interfering signals to filter 108. In addition, because trim value 112 is stored, slave filter 108 may be retuned periodically rather than continuously, resulting in increased efficiency as compared to other circuits that require continuous tuning. To further capitalize on this advantage, particular embodiments of filter 108 may include highly stable components that exhibit little drift in component values. In such embodiments, filter 108 needs to be tuned less frequently, and thus, filter 108 may expend less power than circuits that require continuous or more frequent tuning.

The actual tuning process used to tune filter 108 may vary. For example, filter 108 may be tuned using analog control by converting trim value 112 from a digital value to an analog value that is in turn used to adjust component values for filter 108. In another example, filter 108 may be tuned using a digital process, such as adjusting a current through filter 108 by physically switching between one or more resistors based on one or more bits of trim value 112. Such processes may use pairs of resistors with progressively larger or smaller resistance values so that, for instance, the most significant bit of trim value 112 selects between a pair of resistors with relatively high resistance values, while the least significant bit selects between resistors with relatively low resistance values. Other embodiments may use a combination of analog and digital techniques in order to exploit particular advantages and/or reduce drawbacks associated with one or the other method. One such embodiment is illustrated in FIG. 5.

FIG. 5 illustrates a particular embodiment of a transconductor 500 that forms a component of slave filter 108. In the depicted embodiment, transconductor 500 comprises transconductors 502 and 504, digital control module 512, analog control module 514, and digital-to-analog module 516. Transconductor 500 uses a digital input signal 518, such as trim value 112, to tune an output signal 510 produced by transconductors 502 and 504. Although the tuning of transconductor 500 is detailed with respect to the use of trim value 112, transconductor 500 may be tuned using any suitable value whether or not the value was derived using the techniques described with respect to FIGS. 1–4. Furthermore, although transconductor 500 is detailed with respect to use as a filter, it should be understood that transconductor 500 may be used to form a filter, amplifier, mixer, integrator, charge pump, or other suitable electronic component.

Transconductors 502 and 504 are electronic components that produce respective output currents 506 and 508 from an input voltage 503. The gain of transconductor 500, or the relationship between the output current and the input voltage, is controlled by a voltage or current placed on the transconductor, known as the "control" voltage or current. A common example of a transconductor is a transistor, in which the amount of current flowing from collector to emitter is controlled by a base voltage. Transconductors 502 and 504 may also include one or more resistors used to control the transconductor's gain, or transconductance.

In the depicted embodiment, transconductor 502 is a digitally controlled transconductor, so that the gain of transconductor 502 is determined by a digital control signal 521. For example, transconductor 502 may switch to a particular combination of resistors in response to digital control signal 521. The gain of transconductor 504 is continuously tunable by analog control module 514 within a certain range of output current 508 that is selected digitally. The respective output currents 506 and 508 of transconductors 502 and 504 are combined to form a total output current 510 for transconductor 500.

Digital control module 512 includes any hardware and/or software that receives a digital input signal 520 and produces digital control signal 521 for transconductors 502 and 504. For transconductor 502, which is only digitally controlled, digital control module 512 determines the gain of transconductor 502. For transconductor 504, digital control module 512 determines a range of transconductances, and analog control module 514 then tunes the gain of transconductor 504 within that range. Analog control module 514 is any hardware and/or software that receives an analog signal 522 and tunes the value of the gain of transconductor 504 based on analog signal 522. The gain of transconductors 502 and/or 504 may be determined, tuned, or otherwise controlled at least in part by controlling the value of output currents 506 and/or 508.

Digital-to-analog module 516 represents any component that receives trim value 112 as an input signal and produces digital signal 520 and analog signal 522 from trim value 112. Digital-to-analog module 516 may perform any suitable calculation, extraction, and/or conversion to produce digital signal 520 and analog signal 522. In the depicted embodiment, digital-to-analog module 516 extracts m bits of n-bit trim value 112, where m is any number less than n, and generates m-bit digital signal 520 such that the value of each bit in digital signal 520 is identical to a corresponding bit in the m bits extracted from trim value 112. The m bits of digital signal 520 may be the m most significant bits of trim value 112, the m least significant bits, or any other suitable bits corresponding to the digital adjustment of output currents 506 and 508. In general, any suitable selection of number or arrangement of bits to relate the tuning process performed on master circuit 106 to the tuning process performed on slave filter 108 may be used. Digital-to-analog module 516 converts the remaining (n-m) bits of trim value 112 into analog signal 522 using any suitable digital-to-analog conversion technique.

To relate the tuning process performed on master circuit 106 to the one performed on slave filter 108, control modules 512 and 514 and digital-to-analog module 516 are suitably calibrated so that the steps of the tuning process performed on master circuit 106 correspond to adjustments to the gains of transconductors 502 and 504. For example, coarse adjustments to current source 222 may correspond to the adjustments applied by digital control module 512, while finer adjustments may correspond to the adjustments applied by analog control module 514. Similarly, the correspondence of particular bits to certain types of adjustments, such as associating most significant bits with coarse adjustments, may be pre-programmed as well. In general, any suitable mathematical relationship, proportion, or correspondence between master circuit 106 and slave filter 108 may be used to determine the proper tuning for slave filter 108 from trim value 112.

In operation, digital-to-analog module 516 receives trim value 112, generates digital signal 520 and analog signal 522 from trim value 112, and communicates digital signal 520 to digital control module 512 and analog signal 522 to analog control module 514. Based on digital signal 520, digital control module 512 sets the gain for transconductor 502 and sets a gain range for transconductor 504. Analog control module 514 tunes the gain of transconductor 504 based on analog signal 522 within the range selected by digital control 512. These adjustments to the gains of transconductors 502 and 504 in turn control total output current 510 of transconductor 500, and therefore the gain of transconductor 500. In this regard, the described process tunes the gain of transconductor 500 using trim value 112.

The advantages of the described combination of analog and digital tuning may be best understood with reference to FIG. 6. FIG. 6 is a graph 600 that generally illustrates the response of the transconductance, or gain, of tunable transconductor 504 to a control voltage. Curves 602 and 604 illustrate the response of transconductor 500 to the combined analog and digital control described above. The X-axis labeled Vcontrol represents an analog control voltage, such as signal 522 of FIG. 5. The Y-axis represents the gain, or Gm, of a transconductor. In general, curve 602 applies when the digital word applied by signal 521 represents a binary one. Curve 604 applies when the digital word applied by signal 521 represents a binary zero. Curve 606 illustrates the normalized response of a transconductor to a purely analog control signal, such as in prior systems. Line 608 represents the point at which the gain characteristics of transconductor 500 switch from curve 602 to curve 604.

A notable characteristic of curve 606 is the relatively high slope near the lower end of the analog tuning range. In that range of control voltages, a relatively small change in control voltage can produce a large change in transconductance, making it difficult and/or inaccurate to tune transconductor 504 in that range. This is not an uncommon difficulty faced by analog tuning devices, since transconductors frequently require a certain minimum level of current to function optimally. In particular, when the tuning range is relatively large, it may be difficult to find components that are able to operate sufficiently well over the entire tuning range without seeing a noticeable decline in performance in the lower end of the operating range. Physically switching between discrete component values, as used in purely digital tuning, does not have that drawback, but the multiple components may introduce parasitic capacitance that impairs the operation of filter 108.

Curves 602 and 604 illustrate the improved sensitivity of transconductor 500 when controlled by a combination of digital and analog control. The slope of curves 602 and 604 remain relatively low compared to the steep slope at the lower end of curve 606. This permits more accurate tuning of transconductor 500 throughout its operating range. Furthermore, the depicted example requires only one switch to switch between digital ranges, thus reducing the amount of parasitic capacitance relative to a purely digital method. Consequently, the combination of analog and digital tuning provides increased accuracy relative to purely analog tuning, but less disruption in the performance of filter 108 as compared to purely digital methods.

FIG. 7 is a flow chart 700 that illustrates an example method of operation using a combination of analog and digital control to tune transconductor 500 based on trim value 112. Some or all of the steps in flow chart 700 may be performed by software embodied in a computer readable medium. Transconductor 500 receives trim value 112 at step 702. Digital-to-analog module 516 identifies selects a bit of trim value 112 at step 704 and communicates the bit to digital control module 512 as digital signal 520 at step 706. In a particular embodiment, digital-to-analog module 516 selects the most significant bit of trim value 112 to communicate to digital control module 512 as digital signal 520. In another embodiment, digital-to-analog module 516 selects multiple bits to communicate to digital control module 512 as digital signal 520. Digital control module 512 determines whether the value of the bit is one or zero at decision step 708.

If the value of the bit is zero, then digital control module 512 sets the gain of transconductor 502 at low at step 710. "Low" refers to the lower of two possible values for gain. Digital control module 512 also sets the gain range of transconductor 504 to the lower of two possible ranges at step 712. If the value of the bit is one, digital control module 512 sets the gain of transconductor 502 at the higher value at step 714, and similarly sets the gain range of transconductor 504 to the higher range at step 716. In this regard, digital control module 512 sets the tuning range of transconductor 500 based on the value of the bit communicated as digital signal 520. In the embodiment where multiple bits are communicated, digital control module 512 may set a subrange within the tuning range based on the additional bits.

Digital-to-analog module 516 determines the remaining bits of trim value 112 other than the bit or bits selected at step 718. Digital-to-analog module 516 converts the remaining bits to analog signal 522 at step 720, and communicates analog signal 522 to analog control module 514 at step 722. Analog control module 514 tunes the gain of transconductor 504 based on analog signal 222 at step 724. This tuning is performed within the gain range previously set either at step 712 or at step 716. In this regard, the gain of transconductor 500 is tuned based on the remaining bits in trim value 112.

The example method described is only one of many possible methods of tuning transconductor 500 using trim value 112. In particular, other embodiments may use more than one digital bit to set the gain of transconductors 502 and 504. In some other embodiments, the association between the significance of bits and whether those bits are used in analog or digital tuning may vary. Still other embodiments may allow transconductor 502 to be tuned by analog control module 514 as well. The described method is adaptable to any of these variations, as well as to any other method of operation consistent with those described above.

FIG. 8 illustrates one embodiment of a slave filter 108 that includes variable-gain transconductors 500a and 500b, and capacitor 802. In general, each of transconductors 500a and 500b comprises the components of the transconductor 500 represented in FIG. 5. Filters constructed using these components are commonly referred to as $G_m$-C filters. A $G_m$-C filter's characteristics are governed by the relationship of the transconductance, or $G_m$, to the value of the capacitor. Without tuning, the transfer function H(ω), or Vout/Vin, of filter 108 is given by:

$$H(\omega) = \frac{G_{mo}/C_o}{j\omega + G_{mo}/C_o} \quad (1)$$

As can be seen, the low-pass corner frequency of filter 108, or $\omega_o$, is equal to $G_{mo}/C_o$. Note that only the ratio of the transconductance and capacitance is relevant. So, for example, if the absolute value of the capacitance were low by 15% from some nominal value, the transconductance would be lowered by the same 15% to arrive at the nominal frequency response.

An example of applying tuning to filter 108 by using trim value 112 to change the gain of transconductors 500a and 500b could give the filter's transfer function as the following:

$$H(\omega) = \frac{(\text{trim } 112 * G_{mo})/C_o}{j\omega + \frac{(\text{trim}112 * G_{mo})}{C_o}} \quad (2)$$

Now, the low-pass corner frequency of filter 108, or $\omega_o$, is equal to $(\text{trim}*G_{mo})/C_o$. Thus, the corner frequency may be changed by modifying trim value 112. This is advantageous for several reasons. For example, trim value 112 may be used to overcome the variance of other filter components to arrive at a pre-determined, constant corner frequency. Alternatively, many applications can benefit from filters that are frequency-agile, or are able to change their operating characteristics to several different values over time. Filter 108 can provide each of these types of functionality and advantages.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for storing a result of a tuning process, comprising:
   a) generating a first characteristic signal;
   b) generating a second characteristic signal in response to a current signal;
   c) determining an adjustment to the current signal based at least in part upon the first and second characteristic signals;
   d) storing, in a memory, a digital value representing the adjustment;
   e) repeating elements a) through d) iteratively and updating the digital value stored in the memory after each iteration; and
   f) stopping the iterative repetition upon performing a predetermined number of iterations.

2. The method of claim 1, wherein:
   the digital value comprises a plurality of bits; and
   the method further comprises storing the result of each iteration in a bit of the digital value.

3. The method of claim 1, wherein the adjustment to the current signal during a particular iteration is based on the last bit of the digital value stored.

4. The method of claim 1, wherein the first characteristic signal comprises a voltage measured across a reference capacitor of a signal generator and the second characteristic signal comprises a voltage measured across a capacitor of a master circuit.

5. The method of claim 4, wherein determining comprises comparing voltages across the respective capacitors when the reference capacitor reaches a predetermined voltage.

6. The method of claim 1, wherein:
   the second characteristic signal is generated using a master circuit that is part of an integrated circuit; and
   the first characteristic signal is generated by a signal generator that comprises:
      an external reference capacitor; and
      an external reference resistor.

7. The method of claim 1, wherein storing the digital value is performed even if circuitry used to complete the filter tuning process is powered down or disabled.

8. The method of claim 1, wherein the step of determining comprises:
   generating a clock signal when the first characteristic signal reaches a predetermined voltage;
   storing a data signal in response to the clock signal, the data signal indicating whether the second characteristic signal is greater than or less than the first characteristic signal.

9. The method of claim 8, wherein:
   the digital value comprises a plurality of bits; and
   the step of storing comprises storing the data signal in a bit of the digital value.

10. The method of claim 8, further comprising:
    increasing the current signal if the data signal indicates that the second characteristic signal is less than the first characteristic signal; and decreasing the current signal if the data signal indicates that the second characteristic signal is greater than the first characteristic signal.

11. The method of claim 1, further comprising tuning a filter using the stored digital value.

12. A tuning circuit, comprising:
a signal generator operable to generate a first characteristic signal;
a master circuit operable to receive a current signal and to generate a second characteristic signal in response to the current signal;
a controller operable to:
a) determine an adjustment to the current signal based at least in part upon the first and second characteristic signals;
b) store, in a memory, a digital value representing the adjustment;
c) repeat elements a) and b) iteratively and update the digital value stored in the memory after each iteration; and
a counter operable to maintain a count of a number of iterations completed by the controller, wherein the controller is further operable to stop the iterative repetition of the steps in response to the count reaching a predetermined number; and
the memory operable to store the digital values.

13. The circuit of claim 12, wherein:
the digital value comprises a plurality of bits; and
the controller is further operable to store the result of each iteration in a bit of the digital value.

14. The circuit of claim 12, wherein the adjustment to the current value during a particular iteration is based on the last bit stored in the digital value.

15. The circuit of claim 12, wherein the first characteristic signal comprises a voltage measured across a reference capacitor and the second characteristic signal comprises a voltage measured across a capacitor of the master circuit.

16. The circuit of claim 15, wherein the controller determines the adjustment based on a comparison of the voltages across the respective capacitors when the external reference capacitor reaches a predetermined voltage.

17. The circuit of claim 12, wherein:
the master circuit is part of an integrated circuit; and
the signal generator comprises:
an external reference capacitor; and
an external reference resistor.

18. The circuit of claim 12, wherein the memory continues to store the digital value even if one or more of the signal generator, master circuit, and the controller is powered down or disabled.

19. The circuit of claim 12, wherein:
the controller is further operable to receive a clock signal indicating that the first characteristic signal has reached a predetermined voltage; and
the controller is further operable to store a data signal in the memory in response to the clock signal, the data signal indicating whether the second characteristic signal is greater or less than the first characteristic signal.

20. The circuit of claim 19, wherein:
the digital value comprises a plurality of bits; and
the memory is further operable to store the data signal in a bit of the digital value.

21. The circuit of claim 19, wherein the controller is further operable to:
increase the current signal if the data signal indicates that the second characteristic signal is less than the first characteristic signal; and
decrease the current signal if the data signal indicates that the second characteristic signal is greater than the first characteristic signal.

22. The circuit of claim 12, further comprising a filter that is tuned using the stored digital value.

23. A circuit, comprising:
a first comparator operable to:
compare a first voltage across a first capacitor to a reference voltage; and
generate a signal when the first voltage reaches the reference voltage;
a second comparator operable to compare a second voltage measured across a second capacitor to a third voltage;
a counter operable to maintain a count of the number of signals generated by the first comparator;
a memory operable to store a digital value comprising a plurality of bits; and
a controller operable to receive the signal from the first comparator and, in response, to store the result of the comparison performed by the second comparator in a particular bit of the digital value identified by the count on the counter.

24. The circuit of claim 23, further comprising a reference current source coupled to the first capacitor and operable to charge the first capacitor.

25. The circuit of claim 23, further comprising a variable current source coupled to the second capacitor and operable to charge the second capacitor, wherein the amount of current produced by the variable current source is adjusted based on the result of the comparison performed by the second comparator.

26. The circuit of claim 23, wherein the value of the third voltage comprises the value of the reference voltage.

27. The circuit of claim 23, wherein the value of the third voltage comprises the value of the first voltage.

28. The circuit of claim 23, further comprising a filter that is tuned using the stored digital value.

29. A system, comprising:
means for generating a first characteristic signal;
means for generating a second characteristic signal in response to a current signal;
means for iteratively determining an adjustment to the current signal based at least in part upon the first and second characteristic signals;
means for storing a digital value representing the adjustment, wherein the means for storing is operable to update the digital value after each iteration;
means for counting a number of iterations performed by the means for determining the adjustment; and
means for stopping the iteration of the means for determining upon the means for determining performing a predetermined number of iterations.

* * * * *